(12) United States Patent
Chen

(10) Patent No.: US 11,768,244 B2
(45) Date of Patent: Sep. 26, 2023

(54) METHOD FOR MONITORING BATTERY SAFETY AND TERMINAL DEVICE

(71) Applicant: GUANGDONG OPPO MOBILE TELECOMMUNICATIONS CORP., LTD., Guangdong (CN)

(72) Inventor: Wei Chen, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 318 days.

(21) Appl. No.: 16/226,393

(22) Filed: Dec. 19, 2018

(65) Prior Publication Data

US 2019/0120912 A1    Apr. 25, 2019

Related U.S. Application Data

(63) Continuation of application No. PCT/CN2017/099125, filed on Aug. 25, 2017.

(51) Int. Cl.

| G01R 31/36 | (2020.01) |
| G01R 31/371 | (2019.01) |
| G01R 31/388 | (2019.01) |
| H01M 10/0525 | (2010.01) |
| H01M 10/42 | (2006.01) |
| H01M 10/48 | (2006.01) |
| H02J 7/00 | (2006.01) |

(52) U.S. Cl.
CPC ......... *G01R 31/3648* (2013.01); *G01R 31/36* (2013.01); *G01R 31/3646* (2019.01); *G01R 31/371* (2019.01); *G01R 31/388* (2019.01); *H01M 10/0525* (2013.01); *H01M 10/42* (2013.01); *H01M 10/48* (2013.01); *H02J 7/0029* (2013.01); *H02J 7/0047* (2013.01)

(58) Field of Classification Search
CPC .............. G01R 31/371; G01R 31/3646; G01R 31/388
See application file for complete search history.

(56) References Cited

U.S. PATENT DOCUMENTS

| 9,372,238 B2 * | 6/2016 | Kim .................... G01R 31/3835 |
| 10,013,678 B2 * | 7/2018 | Matsuyama ........... G06Q 10/20 |
| 10,408,887 B2 * | 9/2019 | Shimizu ............... G01R 31/392 |

(Continued)

FOREIGN PATENT DOCUMENTS

| CN | 102403551 A | 4/2012 |
| CN | 103809066 A | 5/2014 |

(Continued)

OTHER PUBLICATIONS

Extended European Search Report issued in corresponding European Application No. 17913116.4 dated Nov. 14, 2019.

(Continued)

*Primary Examiner* — Manuel L Barbee
(74) *Attorney, Agent, or Firm* — Young Basile Hanlon & MacFarlane, P.C.

(57) ABSTRACT

A method for monitoring battery safety is provided and includes the following operations. Duration of a constant-voltage charging stage when a terminal device is charged is acquired. A battery of the terminal device is determined to be abnormal, when the duration is longer than or equal to a preset time period.

18 Claims, 4 Drawing Sheets

(56) References Cited

U.S. PATENT DOCUMENTS

| | | | |
|---|---|---|---|
| 2003/0006735 | A1 | 1/2003 | Kawakami et al. |
| 2009/0184685 | A1 | 7/2009 | Sim et al. |
| 2009/0309547 | A1* | 12/2009 | Nakatsuji ............... H02J 7/0086 |
| | | | 320/164 |
| 2011/0267009 | A1 | 11/2011 | Nakatsuji et al. |
| 2016/0109522 | A1* | 4/2016 | Kim ................... G01R 31/3842 |
| | | | 702/63 |
| 2018/0052207 | A1* | 2/2018 | Kanai ..................... G01R 31/36 |
| 2018/0149701 | A1* | 5/2018 | Koo ....................... G01R 31/385 |
| 2018/0172770 | A1* | 6/2018 | Sun ........................ B60L 3/0084 |
| 2018/0183252 | A1* | 6/2018 | Kim ....................... H01M 10/48 |
| 2019/0025382 | A1* | 1/2019 | Yamada ................ G01R 31/371 |

FOREIGN PATENT DOCUMENTS

| | | |
|---|---|---|
| CN | 105264764 A | 1/2016 |
| CN | 106129508 A | 11/2016 |
| CN | 106324525 A | 1/2017 |
| CN | 106663957 A | 5/2017 |
| CN | 106785144 A | 5/2017 |
| CN | 107015158 A | 8/2017 |
| CN | 107290684 A | 10/2017 |
| JP | H11271408 A | 10/1999 |
| WO | 2017006319 A1 | 1/2017 |

OTHER PUBLICATIONS

First examination report issued in corresponding IN application No. 201817047246 dated Mar. 11, 2020.
China Second Office Action with English Translation for CN Application 201780035697.8 dated Feb. 5, 2021. (12 pages).
The first OA with English Translation issued in corresponding CN application No. 201780035697.8 dated Sep. 30, 2020.
Chinese Office Action with English Transaction for CN Application 201780035697.8 dated May 11, 2021. (10 pages).
Chinese Notice of reexamination with English Translation for CN Application 201780035697.8 dated Nov. 7, 2022. (22 pages).
Chinese Review decision with English Translation for CN Application 201780035697.8 mailed Jan. 18, 2023. (34 pages).

* cited by examiner

METHOD FOR MONITORING BATTERY SAFETY AND TERMINAL DEVICE

CROSS-REFERENCE TO RELATED APPLICATION(S)

This application is a continuation of International Application No. PCT/CN2017/099125, filed on Aug. 25, 2017, the disclosure of which is hereby incorporated by reference in its entirety.

TECHNICAL FIELD

This disclosure relates to the technical field of terminal device, and more particularly, to a method for monitoring battery safety, a system for monitoring battery safety, a terminal device, and an adaptor with the system for monitoring battery safety.

BACKGROUND

A battery is a source of power for a terminal device such as a mobile phone and provides long-term steady power supply for the terminal device. The battery that was first used for the terminal device is a Nickel chromium battery or a Ni-MH (Nickel-metal hydride) battery. However, as a screen of the terminal device is getting larger, the terminal device is getting more powerful, etc., capacities of the Nickel chromium battery and the Ni-MH battery are already unable to satisfy requirements on power. Instead, a Lithium-ion battery has a great number of advantages. For example, due to its high energy density, the Lithium-ion battery can be made lighter and of higher capacity, charges and discharges faster, and has no memory effect compared with the Nickel chromium battery and the Ni-MH battery. In addition, the Lithium-ion battery causes the least harm to elements in the environment. Therefore, the Lithium-ion battery has gradually replaced the conventional Nickel chromium battery and the conventional Ni-MH battery.

Although the Lithium-ion battery has effectively solved the problem of battery capacity, a problem of safety still exists. For example, when the Lithium-ion battery is damaged and thus leads to a short circuit, heat is produced inside a cell. When the heat is produced too fast, the battery will probably burst into fire and explosion. Therefore, safety monitor needs to be conducted on the battery to avoid accidents.

SUMMARY

According to a first aspect of the disclosure, there is provided a method for monitoring battery safety. Duration of a constant-voltage charging stage is acquired when a terminal device is charged. A battery of the terminal device is determined to be abnormal, when the duration is longer than or equal to a preset time period.

According to a second aspect of the disclosure, there is provided a terminal device. The terminal device includes at least one processor and a computer readable storage. The computer readable storage is coupled to the at least one processor and stores at least one computer executable instruction thereon which, when executed by the at least one processor, causes the at least one processor to carry out the following. Duration of a constant-voltage charging stage is determined when a terminal device is charged. A battery of the terminal device is determined to be abnormal, when the duration is longer than or equal to a preset time period.

According to a third aspect, there is provided a non-transitory computer readable storage medium. The non-transitory computer readable storage medium stores computer programs which, when executed by a processor, are operable with the processor carry out the following. Duration of a constant-voltage charging stage is determined when a terminal device is charged. A battery of the terminal device is determined to be abnormal, when the duration is longer than or equal to a preset time period.

DETAILED DESCRIPTION

Figure 1:
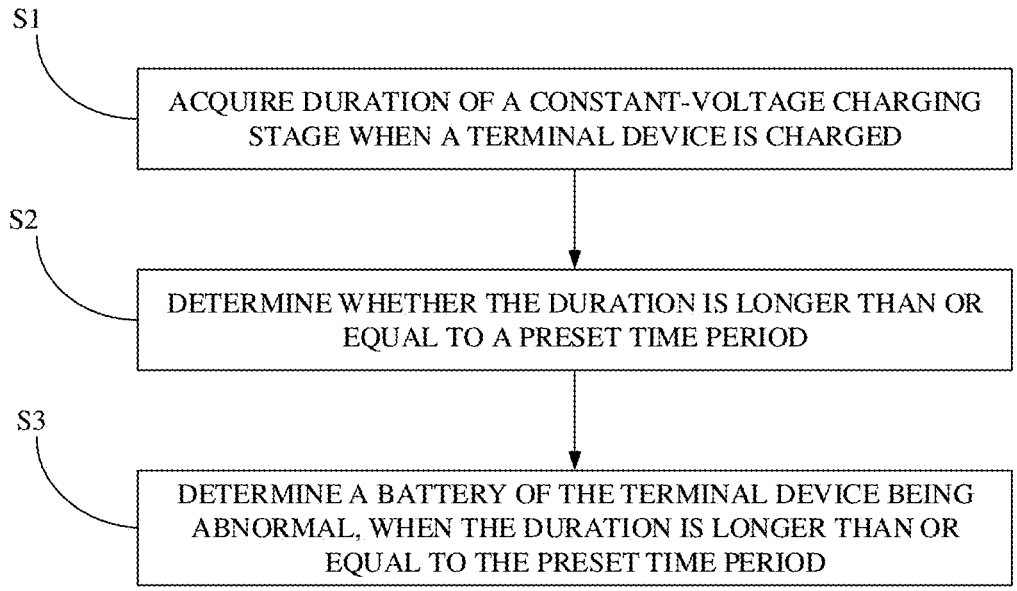
FIG. 1 is a flowchart illustrating a method for monitoring battery safety according to an implementation of the present disclosure.

Implementations of the present disclosure will be further described below with reference to the accompanying drawings, where the same or similar reference numerals denote the same or similar elements or elements with the same or similar functions. It will be appreciated that the implementations described hereinafter with reference to the accompanying drawings are illustrative and for the purpose of explanation rather than restriction of the disclosure.

Before the method for monitoring battery safety, the system for monitoring battery safety, the terminal device with the system for monitoring battery safety, and the adaptor with the system for monitoring battery safety of implementations of the present disclosure are described, structure of a battery of the terminal device and existing potential safety hazard will be first described below.

For instance, a Lithium-ion battery mainly includes a cell and a battery protection system. The cell is referred to as the "heart" of the Lithium-ion battery and includes anode materials and cathode materials, electrolyte, isolation membrane, and housing, and outside is the battery protection system. The anode materials of the cell are Lithium molecular materials such as Lithium Manganate, Lithium Cobaltate, etc. and determine energy of the battery. The cathode material is graphite. The isolation membrane is set between the anode and the cathode of the battery. To make it easier to understand, the isolation membrane is like a piece of paper which is continuously folded within a small battery case and filled with the anode and cathode materials and the electrolyte. In a charging process, an external electric field activates Lithium molecules in the anode material to drive the Lithium molecules to the cathode to make the Lithium molecules be stored in gaps of a graphic electrode structure. More Lithium molecules being activated results in more energy stored. In a discharging process, Lithium ions in the cathode are driven to the anode and become the initial Lithium molecules in the anode. The above steps are repeated to achieve charging and discharging of the battery.

The isolation membrane is mainly configured to isolate completely the anode material from the cathode material. Once the anode material contacts directly the cathode material, a short circuit occurs inside the battery, thereby leading to some potential safety hazard. Therefore, the isolation membrane cannot be too thin since a thin isolation membrane tends to be damaged. However, with more requirements on the terminal device of users, such as a lighter and thinner terminal device, a larger screen, and longer battery life, manufacturers are made to search for a battery with higher energy density. For example, increase energy density by filling in more anode materials and more cathode materials. Nevertheless, for the same volume, more anode materials and more cathode materials filled in results in thinner isolation membrane. Since the isolation membrane tends to be damaged when the battery is subject to damage such as external impact, a short circuit will probably occur.

As an implementation, when the battery is subject to external mechanical damage such as squeezing, dropping, and piercing, due to thin isolation membrane, a short circuit between the anode and the cathode (that is, an internal short circuit within the battery) tends to occur because of damage of isolation membrane. Once the battery is damaged, due to the internal short circuit, there always exists current leakage in the damaged battery.

When the battery is subject to mechanical damage, only minor damage occurs mostly. For this reason, the battery which has the internal short circuit is difficult to identify, since such a battery still appears to be in a normal state. Nevertheless, such a battery where there exists the internal short circuit due to damage can still result in some potential safety hazard.

As another implementation, in the charging and discharging process of the battery, Lithium ion may accumulate in the anode and the cathode. When accumulation occurs, a type of dendrite, like crystal formed by many substances, is formed and can gradually become longer. The dendrite may also pierce the isolation membrane, thereby resulting in the internal short circuit in this process.

Once there is short circuit, when the battery is in use, large quantities of heat are produced inside the cell. The heat can result in vaporization of the electrolyte inside the cell. When the heat is produced too fast, the vaporization process can be very fast, which can cause increase in internal pressure of the cell. When the internal pressure reaches up to a certain extent, the housing is unable to bear the excessive pressure and thus can crack, thereby resulting in explosion. When the housing is in contact with open fire, the battery can burst into fire.

In addition, besides increasing energy density making isolation membrane increasingly thinner, and thinner isolation membrane resulting in damage of isolation membrane which causes accidents, quick charging is also one of major factors of potential safety hazard of the battery.

Quick charging, as the name suggests, is a process of charging fast a rechargeable battery. For example, a charging process of the battery can include at least one of a trickle charging stage, a constant-current charging stage, and a constant-voltage charging stage. In the trickle charging stage, a current feedback loop can be utilized to make current flowing into the battery in the trickle charging stage satisfy expected charging current of the battery (such as a first charging current). Exemplarily, when voltage is lower than 3.0V (volt), a 100 mA (milliampere) charging current is adopted to pre-charge the battery. In the constant-current charging stage, a current feedback loop can be utilized to make current flowing into the battery in the constant-current charging stage satisfy expected charging current of the battery (such as a second charging current, which may be larger than the first charging current). Exemplarily, the charging current can range from 0.1 C (Coulomb) to several Coulombs according to different batteries, where C represents battery capacity. Generally, in the constant-current charging stage, a 0.1 C charging current is adopted for charging in a normal charging mode (corresponding to the second charging mode). However, in a quick charging mode (corresponding to the first charging mode), a charging current larger than 0.1 C is adopted for charging to complete charging within a short time period in the constant-current charging stage. In the constant-voltage charging stage, a voltage feedback loop can be utilized to make voltage applied to the battery in the constant-voltage charging stage satisfy expected charging voltage of the battery. In the constant-voltage charging stage, the charging voltage of the battery basically remains constant while the charging current of the battery gradually decrease. When the charging current is decreased to zero or a certain value, the battery is determined to be fully charged and the constant voltage charging stage ends. Exemplarily, when voltage of the battery is equal to 4.2V, proceed to the constant-voltage charging stage, where charging voltage is constantly 4.2V. When the battery is gradually fully charged, the charging current can be decreased. When the charging current is smaller than 100 mA, it can be determined that the battery is fully charged.

In the constant-current charging stage, since the charging current is large (such as 0.2 C~0.8 C, or even up to 1 C) and the charging process of the battery is an electrochemical reaction, heat is certainly produced in this process. In addition, larger charging current leads to larger quantities of heat produced within a short time period. When the isolation membrane has been damaged, thereby causing the internal short circuit of part of the battery, more heat tends to be produced. Vaporization of the electrolyte occurs, which can cause increase in internal pressure of the cell. When the internal pressure reaches up to a certain extent, the housing is unable to bear the excessive pressure and thus can crack, thereby resulting in explosion. When the housing is in contact with open fire, the battery can burst into fire.

In other words, once there is internal short circuit of the battery, the battery is abnormal and thus some potential safety hazard exists, which may result in accidents when the battery is in use.

Inventors of the present disclosure, based on continuous research and experiments on batteries, proves that when the battery is subject to external mechanical damage such as squeezing, dropping, and piercing, the internal short occurs inside the battery. Due to the internal short circuit, there exists current leakage in the damaged battery when the damaged battery is charged. Since the charging current in the constant-voltage charging stage is small, charging time of the damaged battery will get longer in the constant-voltage charging stage.

Based on the above findings and a great number of experimental tests, in order to monitor effectively whether the battery is abnormal due to damage to avoid potential safety hazard of the battery, thereby avoiding accidents, an effective method for monitoring safety, aimed at detecting whether the battery is abnormal, is proposed in the present disclosure.

The following will describe the method for monitoring battery safety, the system for monitoring battery safety, the terminal device, and the adaptor according to implementations of the present disclosure with reference to the accompanying drawings.

In addition, it should be noted that, in implementations of the present disclosure, the "terminal device" can include but is not limited to a device configured via a wired line and/or a wireless interface to receive/transmit communication signals. Examples of the wired line may include, but are not limited to, at least one of a public switched telephone network (PSTN), a digital subscriber line (DSL), a digital cable, a direct connection cable, and/or other data connection lines or network connection lines. Examples of the wireless interface may include, but are not limited to, a wireless interface with a cellular network, a wireless local area network (WLAN), a digital television network (such as a digital video broadcasting-handheld (DVB-H) network), a satellite network, an AM-FM broadcast transmitter, and/or with other communication terminals. A communication terminal configured to communicate via a wireless interface may be called a "wireless communication terminal", a "wireless terminal", and/or a "mobile terminal". Examples of a mobile terminal may include, but are not limited to, a satellite or cellular telephone, a personal communication system (PCS) terminal capable of cellular radio telephone, data processing, fax, and/or data communication, a personal digital assistant (PDA) equipped with radio telephone, pager, Internet/Intranet access, web browsing, notebook, calendar, and/or global positioning system (GPS) receiver, and/or other electronic devices equipped with radio telephone capability such as a conventional laptop or a handheld receiver. In addition, in the implementation of the present disclosure, the device to be charged or terminal can also include a power bank. The power bank can receive charge from the power supply device and thus store the charge, so as to provide the charge to other electronic devices.

FIG. 1 is a flowchart illustrating a method for monitoring battery safety according to an implementation of the present disclosure. As illustrated in FIG. 1, the method for monitoring battery safety of the implementation of the present disclosure includes the following operations.

At S1, acquire duration of a constant-voltage charging stage when a terminal device is charged.

Figure 2:
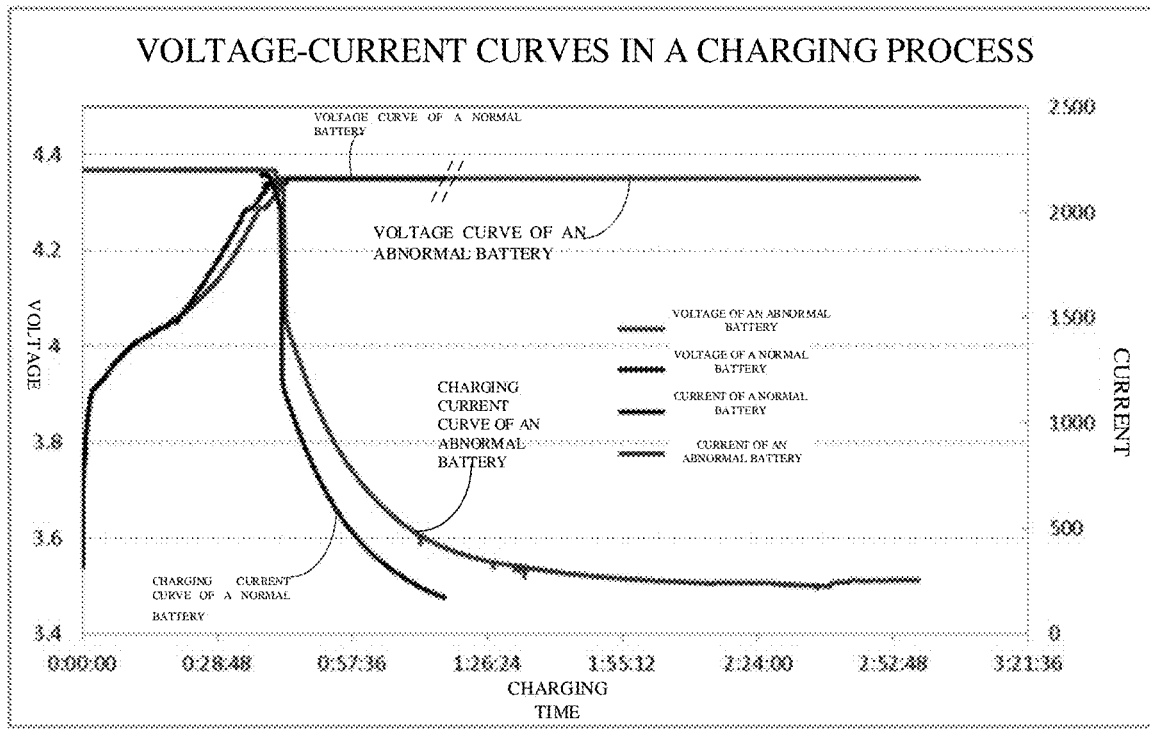
FIG. 2 is schematic diagram illustrating contrast between voltage curves of a normal battery and an abnormal battery and contrast between current curves of a normal battery and an abnormal battery in a constant-voltage charging stage according to an implementation of the present disclosure.

When the terminal device is charged, a charging process generally includes a trickle charging stage, a constant-current charging stage, and a constant-voltage charging stage. In the constant-voltage charging stage, a voltage feedback loop can be utilized to make voltage applied to a battery in the constant-voltage charging stage satisfy expected charging voltage of the battery. When the voltage of the battery reaches a specific value, the constant-voltage charging stage begins; similarly, when the current of the battery is reduced to a specific value, the constant-voltage charging stage ends. For example, as illustrated in FIG. 2, when voltage of the battery is 4.35V, proceed to the constant-voltage charging stage, where charging voltage remains a constant 4.35V. When the battery is gradually fully charged, charging current will decrease. When the charging current is smaller than a preset charging cut-off current such as 100 mA, it can be determined that the battery is fully charged, and the constant-voltage charging stage ends. By determining the starting time and end time of the constant-voltage charging stage as above, duration of the constant-voltage charging state, that is, duration of the battery in the constant-voltage charging stage can be determined.

In the constant-voltage charging stage, when the battery is abnormal due to damage, a partial internal short circuit will occur inside the battery. Due to such internal short circuit, there exists some current leakage in the damaged battery in the constant-voltage charging stage. Since the charging current in the constant-voltage charging stage is small, charging time of the damaged battery will be longer in the constant-voltage charging stage.

Duration of the constant-voltage charging stage can be determined according to charging voltage and charging current of the battery. Specifically, a time point when the charging voltage of the battery reaches a preset voltage is determined as beginning time of the constant-voltage charging stage; a time point when the charging current of the battery is reduced to a preset current is determined as end time of the constant-voltage charging stage; the duration can be determined according to the beginning time and the end time of the constant-voltage charging stage. Which will be detailed below with reference to FIG. 2.

As illustrated in detail in FIG. 2, the charging time for a normal battery is about one hour and ten minutes (see the charging current curve of normal battery of FIG. 2); the charging time for an abnormal battery is about three hours (see the charging current curve of an abnormal battery of FIG. 2), which is much longer than the charging time of a normal battery. Correspondingly, the voltage of the abnormal battery (see the voltage curve of an abnormal battery of FIG. 2) last for longer time than the normal battery (see the voltage curve of a normal battery of FIG. 2). To summarize, duration of an abnormal battery (from time point around 0:43 to time point around 3:00, about two hours and seventeen minutes) is longer than that of a normal battery (from time point around 0:43 to time point around 1:17, about thirty four minutes).

At S2, determine whether the duration is longer than or equal to a preset time period.

At S3, determine a battery of the terminal device is abnormal, when the duration is longer than or equal to the preset time period.

Therefore, according to the method for monitoring battery safety in the implementation of the disclosure, whether there exists self consuming-current in the battery due to the internal short circuit can be determined by monitoring the duration of the constant-voltage charging stage when the battery is charged, so that whether the battery is abnormal can be accurately identified.

According to an implementation of the disclosure, the terminal device is selectively operable in a first charging mode or a second charging mode. Charging speed of the first charging mode is higher than charging speed of the second charging mode. When the terminal device is charged in the first charging mode, the preset time period is longer than or equal to three minutes such as eight to ten minutes. The preset time period varies with charging modes in which the terminal device is charged. In one implementation, the preset time period when the terminal device is charged in the first charging mode is shorter than the preset time period when the terminal device is charged in the second charging mode. For example, when the terminal device is charged in the second charging mode, the preset time period is longer than or equal to twenty minutes such as thirty to one hundred and twenty minutes.

That is to say, the duration of the constant-voltage charging stage can vary with different charging modes in which the terminal device is charged, and thus the preset time period for identifying an abnormal battery is set differently. Specifically, charging speed of the first charging mode is higher than charging speed of the second charging mode, for example, charging current of the first charging mode is larger than charging current of the second charging mode. In general, the second charging mode can be understood as a charging mode with a rated output voltage being 5V and a rated output current being smaller or equal to 2.5 A. In addition, in the second charging mode, a D+ line and a D− line in data lines of an output port of an adaptor can form a short circuit. However, in the first charging mode, the adaptor can utilize the D+ line and the D− line in data lines to communicate with the terminal device to achieve data interaction. That is to say, the adaptor and the terminal device can send a quick charging instruction to each other: the adaptor can send a quick charging enquiry instruction and acquire, after receiving a quick charging response instruction from the terminal device, state information of the terminal device according to the response instruction received from the terminal device to switch on the first charging mode, in which charging current can be larger than 2.5 A and can be, for example, up to 4.5 A or even larger. However, the second charging mode is not limited herein. As long as the adaptor is operable in two charging modes and charging speed (or charging current) of one of the two charging modes is higher (or larger) than charging speed (or charging current) of the other one of the two charging modes, the charging mode with lower charging speed can be understood as the second charging mode. As to charging power, the charging power of the first charging mode can be higher than or equal to 15 W.

According to an implementation of the disclosure, the duration is acquired when the terminal device is in a low-power state. That is to say, when the terminal device is in a low-power state, consuming current of the terminal device is very small and thus will not cause interference with a short circuit current leakage of the abnormal battery, which can improve accuracy in detection.

In the implementation of the disclosure, the low-power state can include a standby state and a power off-state, that is, a battery is lightly loaded or with no load. The battery being with no load refers to the battery being not in a discharge state and there is no outside-consuming-current (not including self-consuming-current resulting from the internal short circuit of the battery), for example, when the terminal device is in the power off-state. The battery being lightly loaded refers to present consuming-current of the battery being approximately between 5 mA and 6 mA, that is, the consuming-current of the battery is very small, for example, when the terminal device is in the standby state or a lightly loaded state.

In addition, it should be noted that, the standby state refers to the display of the terminal device being in a screen off-state and all applications in the background being closed, with only applications related to the present disclosure in a launched state. That is to say, when safety monitor is conducted on the battery, the terminal device is kept in a state of nearly no power consumption. In this way, the duration acquired can be more accurate, which can avoid inaccuracy in detection due to power consumption of the display or power consumption of applications.

In general, when an alternating current (AC) power supply is adopted to supply power, a majority of devices are unable to directly utilize AC to work. Instead, the AC, such as a 220V AC, received from the AC power supply is converted via the adaptor, such as a charger, and then is adopted to charge the battery of the terminal device.

As an implementation, the terminal device includes a charging management module, such as a charging integrated circuit (IC) of the terminal device. The charging management module is configured to manage charging voltage and/or charging current of the battery when the battery is charged. The charging management module functions as a voltage feedback module and/or a current feedback module to achieve management of the charging voltage and/or the charging current of the battery. At the same time, the terminal device can communicate with the adaptor and send information of the battery to the adaptor to manage the charging voltage and/or the charging current of the battery via the adaptor.

For example, when the battery is charged, a trickle charging can be conducted on the battery in the beginning. Then a constant-current charging and a constant-voltage charging can be conducted on the battery. When the charging voltage reaches up to 4.35V, proceed to the constant-voltage charging stage, in which the charging voltage is constantly 4.35V. When the battery is gradually fully charged, the charging current will decrease. When the charging current is smaller than a preset charging cut-off current such as 100 mA, it can be determined that the battery is fully charged and the duration of the battery in the constant-voltage charging stage is acquired.

When the battery is abnormal due to damage, since there is a certain self-consuming current for short circuit, the duration of the battery in the constant-voltage charging stage will be longer. In this way, whether the battery is abnormal can be identified by determining length of the duration.

In implementations of the disclosure, accuracy in detection can be improved by decreasing the preset charging cut-off current. In other words, the preset charging cut-off current being more approximate to the short circuit current leakage inside the battery results in easier identification of abnormality of the battery due to damage.

It can be understood that, operations of executing monitor can be implemented by the terminal device or by the adaptor. In case that whether the battery is abnormal is monitored by the adaptor, the adaptor further communicates with the terminal device to send monitored information indicating that the battery is abnormal to the terminal device such that the terminal device can send alert information. Alternatively, the adaptor itself can also send the alert information, or both the terminal device and the adaptor can send the alert information simultaneously.

As an implementation, the terminal device is charged via the adaptor and communicates with the adaptor. The adaptor acquires the duration and sends information on the battery being abnormal to the terminal device when the adaptor determines that the battery is abnormal according to the duration, whereby the terminal device sends alert information on the battery being abnormal.

As another implementation, the terminal device acquires the duration and sends the alert information on the battery being abnormal, when the terminal device determines that the battery is abnormal according to the duration.

Figure 3:
FIG. 3 is a schematic diagram illustrating alert information of a terminal device according to an implementation of the present disclosure.

For example, when the battery is monitored to be abnormal, it is necessary to send alert information to a user. As an implementation, as illustrated in FIG. 3, the user can be reminded by such alert information as "Battery safety notification: dear customer, your battery is abnormal due to damage at present. For your safety, please get your terminal device inspected and repaired at xxx branch of service.

Thank you". As another implementation, when the user is reminded by the alert information illustrated in FIG. 3, the user can be further reminded by an indicator light flashing. For example, control the indicator light to flash in red light at a high frequency. As yet another implementation, the user can be further reminded by a voice announcement function of the terminal device.

In general, when the user receives the above alert information, the user can promptly get the terminal device inspected and repaired. However, some users fail to realize the seriousness of the problem when they receive the alert information. Therefore, they are likely to ignore the alert information and continue using the terminal device as usual. In this case, the user can be reminded multiple times. For example, the user can be reminded at least three times. When the user still does not deal with the problem after being reminded multiple times, some functions of the terminal device can be restricted.

In an implementation of the disclosure, when the battery is abnormal, a fault grade is determined according to the duration and corresponding functions of the terminal device are restricted according to the fault grade.

It can be understood that, when an internal short circuit of the battery occurs due to damage of the battery, an extent of the internal short circuit varies with an extent of the damage, and corresponding consuming current of short circuit also differs. In general, a larger extent of damage results in a larger extent of the internal short circuit and larger short circuit self-consuming current, thereby resulting in a longer duration of the constant-voltage charging stage. Therefore, the fault grade can be determined according to the length of duration.

For example, damage of the battery can include average damage, relatively serious damage, serious damage, and battery failure according to an extent to which the battery is damaged. Corresponding fault grades can be determined as an average grade, a relatively serious grade, a serious grade, and a complete fault grade. In turn, corresponding functions of the terminal device are restricted according to the fault grade.

In an implementation of the disclosure, the fault grade of the battery can be determined by the adaptor and then fault grade information is sent to the terminal device to restrict corresponding functions of the terminal device.

In another implementation of the disclosure, the fault grade of the battery can be also determined by the terminal device and then some functions of the terminal device are restricted according to the fault grade.

For instance, generally speaking, lower power consumption of applications of the terminal device leads to lower heating when the battery is in use. Exemplarily, an instant messaging (IM) application is only launched without a video chat. In this case, power consumption is low, heating of the battery is low, and thus risks of the battery are less likely to occur. However, when power consumption of the applications is high, such as watching a video, playing a mobile game, etc., power consumption of the battery is high and heating of the battery is high, which can easily cause accidents. Therefore, when the battery is determined to be abnormal, in case that the fault grade is the average grade, forbid use of applications of high power consumption such as video applications, game applications, etc.; in case that the fault grade is the relatively serious grade or the serious grade, forbid directly the entire system to be launched for fear of accidents, and alert information such as "there is potential safety hazard in the battery and the system is forbidden to be launched. Please get the terminal device inspected and repaired at xxx branch of service. Thank you for your cooperation" is displayed on the display of the terminal device to remind the user; in case that the fault grade is the complete fault grade, battery is disabled, the system is powered off and unable to be launched.

In addition, since heating can also occur in a charging process of the battery, especially in a quick charging state where more heating occurs within a short time, when the battery is determined to be abnormal, quick charging of the battery is also forbidden. In a more serious situation, the user is even forbidden to charge the battery for fear of accidents, and alert information such as "due to damage of the battery, charging of the battery is forbidden. Please get the terminal device inspected and repaired at xxx branch of service. Thank you for your cooperation" is displayed on the display of the terminal device to remind the user.

According to the method for monitoring battery safety according to implementations of the disclosure, determine whether the battery is abnormal by acquiring the duration of the constant-voltage charging stage when the terminal device is charged. That is to say, when the battery is damaged, a short circuit occurs inside the battery. Due to such internal short circuit, there always exists current leakage in the damaged battery. In this way, when the terminal device is charged, since the charging current in the constant-voltage charging stage is small, charging duration of the damaged battery will be substantially longer in the constant-voltage charging stage. Whether the battery is abnormal due to damage can be accurately monitored by monitoring the duration of the constant-voltage charging stage when the terminal device is charged according to implementations of the disclosure. When the battery is monitored to be abnormal, prompt alert and repair can be conducted to avoid potential safety hazard caused by the abnormal battery, which can substantially improve safety of the terminal device in use.

In addition, a non-transitory computer readable storage medium is provided in implementations of the disclosure. The non-transitory computer readable storage medium stores computer programs which, when executed by a processor, are operable with the processor to execute the above method for monitoring battery safety.

According to the non-transitory computer readable storage medium, by executing the above method for monitoring battery safety, whether a battery is abnormal due to damage can be accurately monitored by monitoring duration of a constant-voltage charging stage when a terminal device is charged. When the battery is monitored to be abnormal, prompt alert and repair can be conducted to avoid potential safety hazard caused by the abnormal battery, which can substantially improve safety of the terminal device in use.

Figure 4:
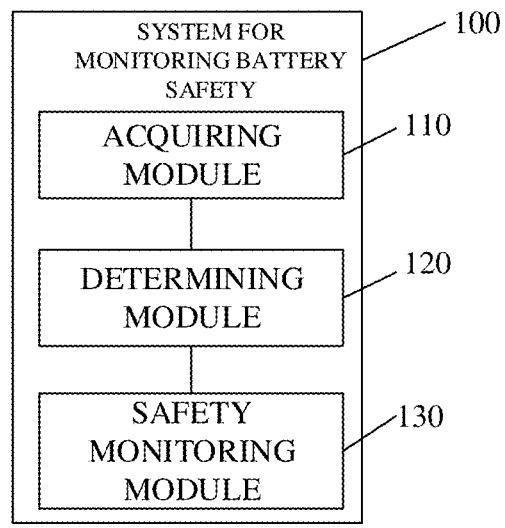
FIG. 4 is a schematic block diagram illustrating a system for monitoring battery safety according to an implementation of the present disclosure.

FIG. 4 is a schematic block diagram illustrating a system for monitoring battery safety according to an implementation of the disclosure. As illustrated in FIG. 4, the system for monitoring battery safety according to the implementation of the disclosure includes an acquiring module 110, a determining module 120, and a safety monitoring module 130.

The acquiring module 110 is configured to acquire duration of a constant-voltage charging stage when a terminal device is charged.

When the terminal device is charged, a charging process generally includes a trickle charging stage, a constant-current charging stage, and a constant-voltage charging stage. In the constant-voltage charging stage, a voltage feedback loop can be utilized to make voltage applied to a battery in the constant-voltage charging stage satisfy expected charging voltage of the battery. For example, as illustrated in FIG. 2, when voltage of the battery is equal to 4.35V, proceed to the constant-voltage charging stage, where charging voltage remains a constant 4.35V. When the battery is gradually fully charged, charging current will decrease. When the charging current is smaller than a preset charging cut-off current such as 100 mA, it can be determined that the battery is fully charged.

In the constant-voltage charging stage, when the battery is abnormal due to damage, a partial internal short circuit will occur inside the battery. Due to the internal short circuit, there exists some current leakage in the damaged battery in the constant-voltage charging stage. Since the charging current in the constant-voltage charging stage is small, charging time of the damaged battery will increase substantially in the constant-voltage charging stage, as illustrated in detail in FIG. 2.

The determining module 120 is configured to determine whether the duration is longer than or equal to a preset time period. The safety monitoring module 130 is configured to determine a battery of the terminal device is abnormal, when the duration is longer than or equal to the preset time period.

Therefore, with aid of the system for monitoring battery safety in the implementation of the disclosure, whether there exists self consuming-current in the battery due to the internal short circuit can be determined by monitoring the duration of the constant-voltage charging stage when the battery is charged, so that whether the battery is abnormal can be accurately identified.

According to an implementation of the disclosure, the terminal device is selectively operable in a first charging mode or a second charging mode. Charging speed of the first charging mode is higher than charging speed of the second charging mode. When the terminal device is charged in the first charging mode, the preset time period is longer than or equal to three minutes such as eight to ten minutes. When the terminal device is charged in the second charging mode, the preset time period is longer than or equal to twenty minutes such as thirty to one hundred and twenty minutes.

According to an implementation of the disclosure, the acquiring module 110 is configured to acquire the duration when the terminal device is in a low-power state. That is to say, when the terminal device is in a low-power state, consuming current of the terminal device is very small and thus will not cause interference with a short circuit current leakage of the abnormal battery, which can improve accuracy in detection.

In the implementation of the disclosure, the low-power state can include a standby state, and a power off-state, that is, a battery is lightly loaded or with no load. The battery being with no load refers to the battery being not in a discharge state and there is no outside-consuming-current (not including self-consuming-current resulting from the internal short circuit of the battery), for example, when the terminal device is in the power off-state. The battery being lightly loaded refers to present consuming-current of the battery being approximately between 5 mA and 6 mA, that is, the consuming-current of the battery is very small, for example, when the terminal device is in the standby state or a lightly loaded state.

In addition, it should be noted that, the standby state refers to the display of the terminal device being in a screen off-state and all applications in the background being closed, with only applications related to the present disclosure in a launched state. That is to say, when safety monitor is conducted on the battery, the terminal device is kept in a state of nearly no power consumption. In this way, the duration acquired can be more accurate, which can avoid inaccuracy in detection due to power consumption of the display or power consumption of applications.

In general, when an AC power supply is adopted to supply power, a majority of devices are unable to directly utilize AC to work. Instead, the AC, such as a 220V AC, received from the AC power supply is converted via the adaptor, such as a charger, and then is adopted to charge the battery of the terminal device.

As an implementation, the terminal device includes a charging management module, such as a charging IC of the terminal device. The charging management module is configured to manage charging voltage and/or charging current of the battery when the battery is charged. The charging management module functions as a voltage feedback module and/or a current feedback module to achieve management of the charging voltage and/or the charging current of the battery. At the same time, the terminal device can be configured to communicate with the adaptor and send information of the battery to the adaptor to manage the charging voltage and/or the charging current of the battery via the adaptor.

For example, when the battery is charged, a trickle charging can be conducted on the battery in the beginning. Then a constant-current charging and a constant-voltage charging can be conducted on the battery. When the charging voltage reaches up to 4.35V, proceed to the constant-voltage charging stage, in which the charging voltage is constantly 4.35V. When the battery is gradually fully charged, the charging current will decrease. When the charging current is smaller than a preset charging cut-off current such as 100 mA, it can be determined that the battery is fully charged and the duration of the battery in the constant-voltage charging stage is acquired.

When the battery is abnormal due to damage, since there exists a certain short circuit self-consuming current, the duration of the constant-voltage charging stage when the terminal device is charged will be longer. In this way, whether the battery is abnormal can be identified by determining length of the duration.

In implementations of the disclosure, accuracy in detection can be improved by decreasing the preset charging cut-off current. In other words, the preset charging cut-off current being more approximate to the short circuit current leakage inside the battery results in easier identification of the abnormal battery due to damage.

It can be understood that, operations of executing monitoring can be completed by the terminal device or by the adaptor. In case that whether the battery is abnormal is monitored by the adaptor, the adaptor is further configured to communicate with the terminal device to send monitored information indicating that the battery is abnormal to the terminal device such that the terminal device can send alert information. Alternatively, the adaptor itself can also be configured to send the alert information, or both the terminal device and the adaptor can be configured to send the alert information simultaneously.

As an implementation, in case that whether the battery is abnormal is monitored by the terminal device, the terminal device is further configured to communicate with the adaptor to send the monitored information on the battery being abnormal to the adaptor and make the adaptor send alert information. Alternatively, the terminal device itself can also be configured to send the alert information, or both the terminal device and the adaptor can be configured to send the alert information simultaneously.

According to an implementation of the disclosure, when the battery is abnormal, alert information on the battery being abnormal is sent by the terminal device.

For example, when the battery is monitored to be abnormal, it is necessary to send alert information to a user. As an implementation, as illustrated in FIG. 3, the user can be reminded by such alert information as "Battery safety notification: dear customer, your battery is abnormal due to damage at present. For your safety, please get your terminal device inspected and repaired at xxx branch of service. Thank you". As another implementation, when the user is reminded by the alert information illustrated in FIG. 3, the user can be further reminded by an indicator light flashing. For example, control the indicator light to flash in red light at a high frequency. As yet another implementation, the user can be further reminded by a voice announcement function of the terminal device.

In general, when the user receives the above alert information, the user can promptly get the terminal device inspected and repaired. However, some users fail to realize the seriousness of the problem when they receive the alert information. Therefore, they are likely to ignore the alert information and continue using the terminal device as usual. In this case, the user can be reminded multiple times. For example, the user can be reminded at least three times. When the user still does not deal with the problem after being reminded multiple times, some functions of the terminal device can be restricted.

In an implementation of the disclosure, when the battery is abnormal, the safety monitoring module 130 is further configured to determine a fault grade according to the duration and corresponding functions of the terminal device are restricted according to the fault grade.

It can be understood that, when an internal short circuit of the battery occurs due to damage of the battery, an extent of the internal short circuit varies with an extent of the damage, and corresponding consuming current of short circuit also differs. In general, a larger extent of damage results in a larger extent of the internal short circuit and larger short circuit self-consuming current, thereby resulting in a longer duration of the constant-voltage charging stage. Therefore, the safety monitoring module 130 can be configured to determine the fault grade according to the length of duration.

For example, damage of the battery can include average damage, relatively serious damage, serious damage, and battery failure according to an extent to which the battery is damaged. Corresponding fault grades can be determined as an average grade, a relatively serious grade, a serious grade, and a complete fault grade. In turn, corresponding functions of the terminal device are restricted according to the fault grade.

In an implementation of the disclosure, the fault grade of the battery can be determined by the adaptor and then fault grade information is sent to the terminal device to restrict corresponding functions of the terminal device.

In another implementation of the disclosure, the fault grade of the battery can be also determined by the terminal device and then some functions of the terminal device are restricted according to the fault grade.

For instance, generally speaking, lower power consumption of applications of the terminal device leads to lower heating when the battery is in use. Exemplarily, an IM application is only launched without a video chat. In this case, power consumption is low, heating of the battery is low, and thus risks of the battery are less likely to occur. However, when power consumption of the applications is high, such as watching a video, playing a mobile game, etc., power consumption of the battery is high and heating of the battery is high, which can easily cause accidents. Therefore, when the battery is determined to be abnormal, in case that the fault grade is the average grade, forbid use of applications of high power consumption such as video applications, game applications, etc.; in case that the fault grade is the relatively serious grade or the serious grade, forbid directly the entire system to be launched for fear of accidents, and alert information such as "there is potential safety hazard in the battery and the system is forbidden to be launched. Please get the terminal device inspected and repaired at xxx branch of service. Thank you for your cooperation" is displayed on the display of the terminal device to remind the user; in case that the fault grade is the complete fault grade, battery failure occurs and the system is powered off and unable to be launched.

In addition, since heating can also occur in a charging process of the battery, especially in a quick charging state where more heating occurs within a short time, when the battery is determined to be abnormal, quick charging of the battery is also forbidden. In a more serious situation, the user is even forbidden to charge the battery for fear of accidents, and alert information such as "due to damage of the battery, charging of the battery is forbidden. Please get the terminal device inspected and repaired at xxx branch of service. Thank you for your cooperation" is displayed on the display of the terminal device to remind the user.

According to the system for monitoring battery safety according to implementations of the disclosure, the acquiring module is configured to acquire the duration of the constant-voltage charging stage when the terminal device is charged, the determining module is configured to determine whether the duration is longer than the preset time period, and the safety monitoring module is configured to determine the battery being abnormal when the duration is longer than the preset time period. That is to say, when the battery is damaged, a short circuit occurs inside the battery. Due to such internal short circuit, there always exists current leakage in the damaged battery. When the terminal device is charged, since the charging current in the constant-voltage charging stage is small, charging duration of the damaged battery will be substantially longer in the constant-voltage charging stage. Whether the battery is abnormal due to damage can be accurately monitored by monitoring the duration of the constant-voltage charging stage of the battery according to implementations of the disclosure. When the battery is monitored to be abnormal, prompt alert and repair can be conducted to avoid potential safety hazard caused by the abnormal battery, which can substantially improve safety of the terminal device in use.

Figure 5:
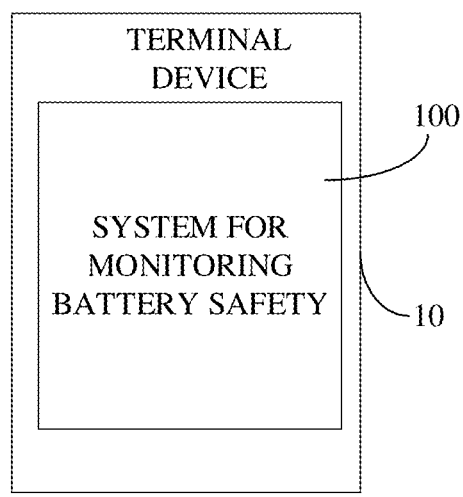
FIG. 5 is a schematic block diagram illustrating a terminal device according to an implementation of the present disclosure.

As illustrated in FIG. 5, another terminal device 10 is provided in an implementation of the disclosure. The terminal device 10 includes the above system for monitoring battery safety 100.

With the system for monitoring battery safety, the terminal device according to the implementation of the disclosure can be configured to monitor accurately whether a battery is abnormal due to damage by monitoring duration of a constant-voltage charging stage of the battery when the terminal device is charged. When the battery is monitored to be abnormal, prompt alert and repair can be conducted to avoid potential safety hazard caused by the abnormal battery, which can substantially improve safety of the terminal device in use.

Figure 6:
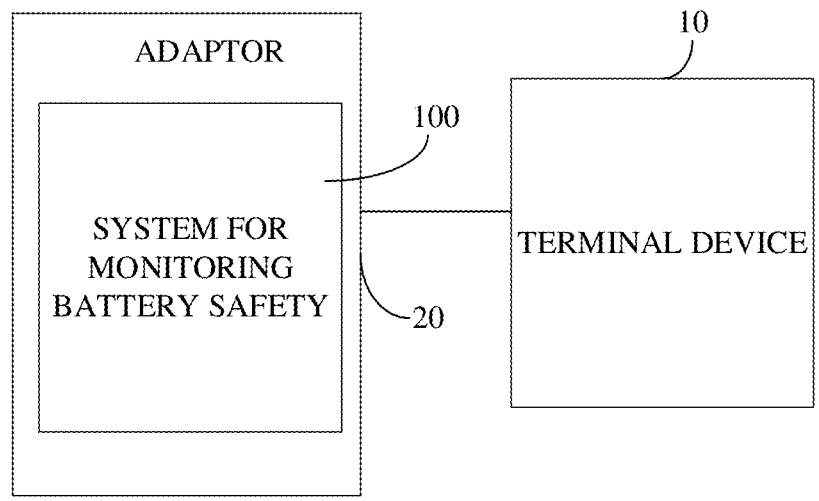
FIG. 6 is a schematic block diagram illustrating an adaptor according to an implementation of the present disclosure.

As illustrated in FIG. 6, an adaptor 20 is provided according to an implementation of the disclosure. The adaptor 20 is configured to communicate with the terminal device 10, and the adaptor 20 includes the above system for monitoring battery safety 100.

With the system for monitoring battery safety 100, the adaptor according to the implementation of the disclosure can be configured to monitor accurately whether a battery is abnormal due to damage by monitoring duration of a constant-voltage charging stage of the battery when the terminal device is charged. When the battery is monitored to be abnormal, prompt alert and repair can be conducted to avoid potential safety hazard caused by the abnormal battery, which can substantially improve safety of the terminal device in use.

Figure 7:
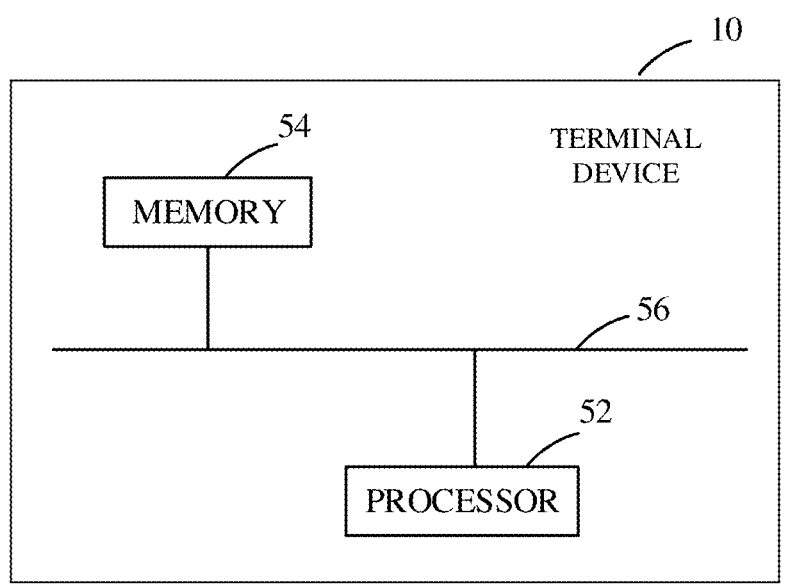
FIG. 7 is a schematic block diagram illustrating a terminal device according to another implementation of the present disclosure.

The units or modules mentioned in the foregoing implementations can be implemented by a processor or can be integrated into a processor. To this end, FIG. 7 illustrates a block diagram of a terminal device 10 according to an implementation of the disclosure. The terminal device 10 includes at least one processor 52 (only one processor is illustrated in the figure) and a computer readable storage 54 such as a memory. The computer readable storage 54 is coupled to the at least one processor 52 via a bus 56 for example and stores at least one computer executable instruction thereon. When executed by the at least one processor, the computer executable instruction can cause the at least one processor to carry out the method for monitoring battery safety mentioned above, which will not be repeated herein.

It should be understood that terms such as "center", "longitudinal", "lateral", "length", "width", "thickness", "on", "under", "front", "back", "left", "right", "vertical", "horizontal", "top", "bottom", "in", "out", "clockwise", "anticlockwise", "axial", "radial", "circumferential", and the like referred to herein which indicate directional relationship or positional relationship are directional relationship or positional relationship based on accompanying drawings and are only for the convenience of description and simplicity, rather than explicitly or implicitly indicate that apparatuses or components referred to herein must have a certain direction or be configured or operated in a certain direction and therefore cannot be understood as limitation on the disclosure.

In addition, terms "first", "second", and the like are only used for description and cannot be understood as explicitly or implicitly indicating relative importance or implicitly indicating the number of technical features referred to herein. Therefore, features restricted by terms "first", "second", and the like can explicitly or implicitly include at least one of the features. In the context of the disclosure, unless stated otherwise, "multiple" refers to "at least two", such as two, three, and the like.

Unless stated otherwise, terms "installing", "coupling", "connecting", "fixing", and the like referred to herein should be understood in broader sense. For example, coupling may be a fixed coupling, a removable coupling, or an integrated coupling, may be a mechanical coupling, an electrical coupling, and may be a direct coupling, an indirect coupling through a medium, or a communication coupling between two components or an interaction coupling between two components. It can be understood by those skilled in the art specific implications of the above terms in the present disclosure according to specific situations.

Unless stated otherwise, a first feature being "on" or "under" a second feature referred to herein can refer to a direct contact between the first feature and the second feature or an indirect contact between the first feature and the second feature via a medium. In addition, the first feature being "above", "over", and "on" the second feature can be the first feature being right above or obliquely above the second feature or only refers to the first feature being at higher horizontal level than the second feature. The first feature being "below", "underneath", and "under" the second feature can be the first feature being right below or obliquely below the second feature or only refers to the first feature being at lower horizontal level than the second feature.

The reference term "an embodiment", "some embodiments", "implementation", "specific implementation", or "some implementations" referred to herein means that a particular feature, structure, material, or characteristic described in conjunction with the embodiment or implementation may be contained in at least one embodiment or implementation of the present disclosure. The phrase appearing in various places in the specification does not necessarily refer to the same embodiment or implementation, nor does it refer to an independent or alternative embodiment or implementation that is mutually exclusive with other embodiments or implementations. In addition, when the embodiment or implementation is not mutually exclusive with other embodiments or implementations, it is expressly and implicitly understood by those skilled in the art that an embodiment described herein may be combined with other embodiments or implementations.

Those of ordinary skill in the art will appreciate that units (including sub-units) and algorithmic operations of various examples described in connection with implementations herein can be implemented by electronic hardware or by a combination of computer software and electronic hardware. Whether these functions are performed by means of hardware or software depends on the application and the design constraints of the associated technical solution. A professional technician may use different methods with regard to each particular application to implement the described functionality, but such methods should not be regarded as lying beyond the scope of the disclosure.

It will be evident to those skilled in the art that the corresponding processes of the above method implementations can be referred to for the working processes of the foregoing systems, apparatuses, and units, for purposes of convenience and simplicity and will not be repeated herein.

It will be appreciated that the systems, apparatuses, and methods disclosed in implementations herein may also be implemented in various other manners. For example, the above apparatus implementations are merely illustrative, e.g., the division of units (including sub-units) is only a division of logical functions, and there may exist other ways of division in practice, e.g., multiple units (including sub-units) or components may be combined or may be integrated into another system, or some features may be ignored or not included. In other respects, the coupling or direct coupling or communication connection as illustrated or discussed may be an indirect coupling or communication connection through some interface, device or unit, and may be electrical, mechanical, or otherwise.

Separated units (including sub-units) as illustrated may or may not be physically separated. Components or parts displayed as units (including sub-units) may or may not be physical units, and may reside at one location or may be distributed to multiple networked units. Some or all of the units (including sub-units) may be selectively adopted according to practical needs to achieve desired objectives of the disclosure.

Additionally, various functional units (including sub-units) described in implementations herein may be integrated into one processing unit or may be present as a number of physically separated units, and two or more units may be integrated into one.

If the integrated units are implemented as software functional units and sold or used as standalone products, they may be stored in a computer readable storage medium. Based on such an understanding, the essential technical solution, or the portion that contributes to the prior art, or all or part of the technical solution of the disclosure may be embodied as software products. Computer software products can be stored in a storage medium and may include multiple instructions that, when executed, can cause a computing device, e.g., a personal computer, a server, a second adapter, a network device, etc., to execute some or all operations of the methods as described in the various implementations. The above storage medium may include various kinds of media that can store program code, such as a USB flash disk, a mobile hard drive, a read-only memory (ROM), a random access memory (RAM), a magnetic disk, or an optical disk.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for monitoring battery safety, comprising:
   acquiring duration of a constant-voltage charging stage when a battery of a terminal device is charged, wherein a charging process of the battery comprises at least one of a trickle charging stage, a constant-current charging stage, and the constant-voltage charging stage, the constant-voltage charging stage ends when the battery is fully charged;
   determining whether the duration is longer than or equal to a preset time period corresponding to a charging mode of the terminal device, wherein the charging mode is a first charging mode or a second charging mode, charging speed of the first charging mode is higher than that of the second charging mode, the first charging mode and the second charging mode each corresponds to one preset time period and the preset time period corresponding to the first charging mode is shorter than the preset time period corresponding to the second charging mode wherein the charging current is greater than 2.5 A in the first charging mode, and a rated output voltage is equal to 5 V and a rated output current is less than or equal to 2.5 A in the second charging mode; and
   determining the battery of the terminal device being abnormal, when the duration is longer than or equal to the preset time period.

2. The method of claim 1, wherein the terminal device is charged via an adaptor and configured to communicate with the adaptor; wherein the method is performed by the adaptor and the method further comprises:
   sending information on the battery being abnormal to the terminal device when the adaptor determines that the battery is abnormal according to the duration, whereby the terminal device sends alert information on the battery being abnormal.

3. The method of claim 1, wherein the method is performed by the terminal device.

4. The method of claim 1, further comprising:
   determining a fault grade according to the duration and restricting corresponding functions of the terminal device according to the fault grade, when the battery is abnormal.

5. The method of claim 4, wherein restricting corresponding functions of the terminal device according to the fault grade comprises one of:
   forbidding use of applications of high power consumption when the fault grade is a first grade;
   forbidding a system to be launched and notifying a user an alert message; and
   disabling the battery, turning off the system, and forbidding the system to be launched.

6. The method of claim 1, wherein the duration is acquired when the terminal device is in a low-power state.

7. The method of claim 1, wherein the acquiring duration of a constant-voltage charging stage when a terminal device is charged comprises:
   determining a time point when charging voltage of the battery reaches a preset voltage value as beginning time of the constant-voltage charging stage;
   determining a time point when charging current of the battery is reduced to a preset current value as end time of the constant-voltage charging stage; and
   determining the duration according to the beginning time and the end time of the constant-voltage charging stage.

8. The method of claim 1, wherein in the constant-voltage stage, charging voltage of the battery remains constant and charging current of the battery decreases to a preset current value.

9. A terminal device, comprising:
   a battery;
   at least one processor; and
   a computer readable storage, coupled to the at least one processor and storing at least one computer executable instruction thereon which, when executed by the at least one processor, causes the at least one processor to carry out actions, comprising:
      determining duration of a constant-voltage charging stage when the battery is charged, wherein a charging process of the battery comprises at least one of a trickle charging stage, a constant-current charging stage, and the constant-voltage charging stage, the constant-voltage charging stage ends when the battery is fully charged;
      determining whether the duration is longer than or equal to a preset time period corresponding to a charging mode of the terminal device, wherein the charging mode is a first charging mode or a second charging mode, charging speed of the first charging mode is higher than that of the second charging mode, the first charging mode and the second charging mode each corresponds to one preset time period and the preset time period corresponding to the first charging mode is shorter than the preset time period corresponding to the second charging mode, wherein the charging current is greater than 2.5 A in the first charging mode, and a rated output voltage is equal to 5 V and a rated output current is less than or equal to 2.5 A in the second charging mode; and
      determining the battery of the terminal device being abnormal, when the duration is longer than or equal to the preset time period.

10. The terminal device of claim 9, wherein the at least one processor configured to carry out the determining duration of a constant-voltage charging stage when a terminal device is charged is configured to carry out actions, comprising:

determining duration of the constant-voltage charging stage according to charging voltage and charging current of the battery.

11. The terminal device of claim 10, wherein the at least one processor configured to carry out the determining duration of the constant-voltage charging stage according to charging voltage and charging current of the battery is configured to carry out actions, comprising:

determining a time point when the charging voltage of the battery reaches a preset voltage as beginning time of the constant-voltage charging stage;
  determining a time point when the charging current of the battery is reduced to a preset current as end time of the constant-voltage charging stage; and
  determining the duration according to the beginning time and the end time of the constant-voltage charging stage.

12. The terminal device of claim 9, wherein the at least one processor is further configured to carry out actions, comprising:

determining a fault grade according to the duration and restricting corresponding functions of the terminal device according to the fault grade, when the battery is abnormal.

13. The terminal device of claim 12, wherein the at least one processor configured to carry out determining the fault grade according to the duration and restricting corresponding functions of the terminal device according to the fault grade is configured to carry out actions, comprising:

forbidding use of applications of high power consumption when the fault grade is a first grade;
  forbidding a system to be launched and notifying a user an alert message; and
  disabling the battery, turning off the system, and forbidding the system to be launched.

14. The terminal device of claim 9, wherein the duration is determined when the terminal device is in a low-power state.

15. A non-transitory computer readable storage medium storing computer programs which, when executed by a processor, are operable with the processor carry out actions comprising:

determining duration of a constant-voltage charging stage when a battery of a terminal device is charged, wherein a charging process of the battery comprises at least one of a trickle charging stage, a constant-current charging stage, and the constant-voltage charging stage, the constant-voltage charging stage ends when the battery is fully charged;
  determining whether the duration is longer than or equal to a preset time period corresponding to a charging mode of the terminal device, wherein the charging mode is a first charging mode or a second charging mode, charging speed of the first charging mode is higher than that of the second charging mode, the first charging mode and the second charging mode each corresponds to one preset time period and the preset time period corresponding to the first charging mode is shorter than the preset time period corresponding to the second charging mode wherein the charging current is greater than 2.5 A in the first charging mode, and a rated output voltage is equal to 5 V and a rated output current is less than or equal to 2.5 A in the second charging mode; and
  determining the battery of the terminal device being abnormal, when the duration is longer than or equal to the preset time period.

16. The non-transitory computer readable storage medium of claim 15, wherein determining duration of the constant-voltage charging stage when the terminal device is charged comprises:

determining a time point when charging voltage of the battery reaches a preset voltage value as beginning time of the constant-voltage charging stage;
  determining a time point when charging current of the battery is reduced to a preset current value as end time of the constant-voltage charging stage; and
  determining the duration according to the beginning time and the end time of the constant-voltage charging stage.

17. The non-transitory computer readable storage medium of claim 15, wherein in the constant-voltage charging stage, charging voltage of the battery remains constant and charging current of the battery decreases to a preset current value.

18. The non-transitory computer readable storage medium of claim 15, wherein when executed by the processor, the computer programs are further operable with the processor carry out actions comprising:

determining a fault grade according to the duration and restricting corresponding functions of the terminal device according to the fault grade, when the battery is abnormal.

* * * * *